(12) United States Patent
Cook

(10) Patent No.: US 8,600,695 B2
(45) Date of Patent: Dec. 3, 2013

(54) PHASE CANCELING CURRENT TRANSDUCER

(75) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 426 days.

(21) Appl. No.: 12/967,361

(22) Filed: Dec. 14, 2010

(65) Prior Publication Data

US 2011/0156698 A1 Jun. 30, 2011

Related U.S. Application Data

(60) Provisional application No. 61/291,729, filed on Dec. 31, 2009.

(51) Int. Cl.
*G06F 19/00* (2011.01)

(52) U.S. Cl.
USPC .......................................................... 702/107

(58) Field of Classification Search
USPC .......................................................... 702/107
See application file for complete search history.

(56) References Cited

U.S. PATENT DOCUMENTS

| | | | | |
|---|---|---|---|---|
| 5,449,991 A * | 9/1995 | Owen | ........................... | 318/500 |
| 7,359,809 B2 * | 4/2008 | Bruno | ........................... | 702/64 |
| 7,447,603 B2 * | 11/2008 | Bruno | ........................... | 702/64 |
| 2006/0129339 A1 * | 6/2006 | Bruno | ........................... | 702/60 |

* cited by examiner

*Primary Examiner* — Bryan Bui
(74) *Attorney, Agent, or Firm* — Chernoff Vilhauer McClung & Stenzel, LLP

(57) ABSTRACT

A phase canceling current transducer for a power meter includes an error correction unit including a memory for storing error correction factors. A data processing device of the error correction unit adjusts the output of the transducer to correct for phase and ratio errors produced by the transducer current transformer or to cause the transducer's output to mimic the output of another current transducer.

25 Claims, 5 Drawing Sheets

PHASE CANCELING CURRENT TRANSDUCER

CROSS-REFERENCE TO RELATED APPLICATIONS

This application claims the benefit of U.S. Provisional App. No. 61/291,729, filed Dec. 31, 2009.

STATEMENT REGARDING FEDERALLY SPONSORED RESEARCH OR DEVELOPMENT

Not applicable.

BACKGROUND OF THE INVENTION

The present invention relates to electric power meters and, more particularly to a phase canceling current transducer for a power meter.

Electric power is typically generated at a remote, central generating facility and transmitted to the consumer over a distribution grid. To reduce transmission losses, a step-up, sub-transmission transformer is used to increase the voltage and reduce the current for transmission over the transmission lines of the distribution grid. The actual transmission line voltage usually depends on the distance between the sub-transmission transformers and the consumers of the electricity but is commonly in the range of 2-35 kilo-volts ("kV"). Distribution substation transformers and distribution transformers of a utility's secondary power distribution system reduce the voltage from the transmission line level to a distribution voltage for delivery and use by industrial, commercial, and residential consumers. In the United States, for example, electric power is typically delivered to a facility as a 60 Hertz (Hz), alternating current (AC) voltage ranging from 120-660 volts ("V"), depending upon the use.

While the total power consumption of a building or other facility is monitored by the electric utility with a power meter located between the distribution transformer and the facility's power distribution panel, in many circumstances, particularly in business environments, it is desirable to monitor the power consumption of individual loads or groups of loads, such as motors, lighting, heating units, cooling units, machinery, etc. or to sub-meter or attribute the facility's power usage and cost to different occupancies, buildings, departments, or cost centers within the facility. These loads are typically connected to one or more of the branch circuits that extend from the power distribution panel and each may be supplied with single phase or multi-phase power. In addition, it is often desirable to monitor several parameters related to efficient electric power distribution and consumption, such as active power, the time rate of transferring or transforming energy; the apparent power, the product of the root mean square (RMS) voltage and current; and the reactive power, the product of the RMS voltage and the quadrature component of the current. Flexibility has favored adoption of digital power meters incorporating data processing systems that can monitor a plurality of circuits and calculate the desired output parameters.

As generated, the fundamental AC voltage and current of the U.S. power grid approximate in-phase, 60 Hertz ("Hz") sine waves over time. The effective or true power of the analog sinusoidal voltage and current waveforms is the integral of the product of the instantaneous magnitudes of the voltage and current averaged over a time period, usually a cycle of the waveform:

$$P = \frac{1}{T}\int_0^T (v(t)i(t))\,dt \qquad (1)$$

where: P=effective or true power (watts)
v(t)=instantaneous voltage at time t
i(t)=instantaneous current at time t
T=time period, typically the period of a waveform cycle Referring to FIG. 1, in a digital power meter 20 the effective power is typically approximated by averaging the sum of a plurality of products of the instantaneous amplitudes of the voltage and current that are obtained by sampling the voltage and current waveforms at periodic intervals for a period of time, typically making up at least one cycle of the waveform:

$$P \cong \frac{1}{T}\sum_{k=1}^{k=\frac{T}{\Delta t}} v(k)i(k)\Delta t \qquad (2)$$

where: P=effective power
v(k)=sample voltage for the k-th sample
i(k)=sample current for the k-th sample
Δt=sampling interval A digital power meter 20 comprises, generally, at least one voltage transducer 22, at least one current transducer 28, voltage and current sampling units 30, 32 and a data processing unit 34 to control the sampling units, read the instantaneous magnitudes of the voltage and current, and calculate the power and other output parameters from respective magnitudes of a plurality of voltage and current samples.

The voltage transducer 22 is commonly a voltage divider network that is connected to the conductor in which the voltage will be measured. The exemplary power meter 20 includes three voltage transducers 22, 24, 26 each connected to a bus bar 36, 38, 40 in a power distribution panel. Each of the bus bars conducts a single phase of the three-phase power delivered to the power distribution panel from the supply 44, typically the distribution transformer for the facility. The power distribution panel provides a convenient location for connecting the voltage transducers because the voltage and phase is the same for all loads attached to a particular bus bar and interconnection of the transducer and the facility's wiring is facilitated by the wiring connections in the power distribution panel. However, the voltage transducer(s) can be interconnected anywhere in the wiring connecting the supply 44 and the load, including connection at the terminals of a load, for example, terminals 46, 48, 50 of the exemplary 3-phase load 52 or the terminal of the single-phase load 54.

A typical current transducer, for example, current transducer 74, comprises a resistor network 56 and an associated current transformer 58. A current transformer typically comprises a core having a portion defining an aperture and a secondary winding that encircles the cross-section of the portion of the core that defines the aperture. For example, the current transformer 58 comprises a secondary winding 60 comprising multiple turns of conductive wire wrapped around the cross-section of a toroidal core 62. The current transducer 70 includes a split core current transformer. The core of a split core current transformer typically comprises a C-shaped or U-shaped first core portion and a second C-shaped core portion, U-shaped core portion or a bar portion that is arranged to connect the ends of the first core portion. The second core portion is typically hinged to the first core portion or separable from the first core portion to facilitate routing a conductor through the core's aperture without disconnecting the conductor.

The conductor of the current that is to be measured is passed through the aperture in the core and constitutes the primary winding of the transformer. Varying current flowing in the primary winding (primary current) induces a secondary voltage and current in the secondary winding which is connected to the resistor network 56. The magnitude of the primary current is determined from the amplitude of the voltage at the output of the resistor network. The primary winding has $N_1$ turns (typically, $N_1$=1) and the secondary winding has $N_2$ turns and, thus, the current transformer has a turns ratio (n) of $N_1/N_2$ and, ideally, the current in the conductor is equal to the product of the current in the second winding and the turns ratio (n).

To measure the power consumed by a load, a current transformer is installed encircling each conductor conducting power to the load (or a conductor of a shunt current representative of the load current). For example, three current transformers 58, 74, 76 are arranged to encircle three conductors 64, 66, 68 connecting the exemplary 3-phase load 52 to the supply 44 and a single split-core current transformer 70 encircles the single conductor 72 connecting the exemplary single-phase load 54 to the supply. (Neutral conductors are not illustrated). The associated resistor networks may be incorporated in the enclosures of the current transformers, for example, enclosure 29 (shown in phantom), and are conductively connected to the power meter.

The digital power metering system includes pluralities of voltage and current transducers and multiplexers 82, 84 sequentially connect respective transducers to respective voltage and current sampling units 30, 32. The sampling units 30, 32 typically comprise an analog-to-digital converter (ADC) including a sample and hold circuit that periodically holds the output voltage of the respective transducer constant and a quantizer that converts the analog output voltage of the transducer to a digital signal. In the sampling units, time, the independent variable of the sinusoidal waveform equation, is converted from a continuum to a plurality of discrete moments and the concurrent magnitudes of the voltage or current transducer signals are converted to discrete, binary values of finite precision. A clock 86, which may be included in the data processing unit 34, provides a time reference enabling the data processing unit to output at least one sampling signal 88 to trigger the sampling of the voltage and current by the respective sampling units 30, 32.

The outputs of the sampling units are read by the data processing unit 34 which, in a typical digital power meter, comprises at least one microprocessor or digital signal processor (DSP). The data processing unit reads and stores the digital values quantifying the magnitudes of the current and voltage samples and uses the values to calculate the current, voltage, power, and other electrical parameters that are output to a display 90 for immediate viewing or to a communications interface 92 enabling transmission to another data processing system, such as a building management computer, for remote display or further processing, for example formulating instructions to automated building equipment. The digital power meter also includes a memory 94 in which operating instructions for the data processing unit, current and voltage samples, and calculated output are stored.

In addition, accurate measurement of electric power requires compensation for error introduced by the transducers of the power meter. For example, the secondary current of a current transformer is ideally equal to the current in the conductor (the primary winding) divided by the number of turns in the secondary winding (turns ratio). However, actual transformers are not ideal transformers and the magnetization of the core of a current transformer causes the primary current to be less than the product of the secondary current and the turns ratio. Current transformer error comprises a phase error and a ratio error and before calculating the current, the data processing system typically adjusts the value of the sensed instantaneous load current to compensate for the effects of phase error and ratio error introduced by the current transformer.

Referring to FIG. 2, the ratio error ($r_e$) varies with the magnitude of the primary current ($I_1$) as follows:

$$r_e(\%) = K_3 + K_4(\log I_1) \quad (1)$$

where $K_3$ and $K_4$ are constants.
The effect of the ratio error is to alter the relationship between the magnitudes of the measured secondary current ($I_2$) and the primary current ($I_1$) from the theoretical relationship, that is:

$$I_1 = I_2(n) \quad (2)$$

where n=turns ratio,
to the relationship:

$$I_1 = I'_2\left(n + \frac{nr_e}{100}\right) \quad (3)$$

where $I'_2$=measured secondary current
The magnitude of the measured secondary current ($I_2'$) is related to the theoretical secondary current ($I_2$), as follows:

$$I_2 = I'_2\left(1 + \frac{r_e}{100}\right) \quad (4)$$

Referring to FIG. 3, magnetization of the transformer core and windings also causes a phase shift between the current in the primary winding and the current in the secondary winding. The resulting phase error (P) varies with the magnitude of the primary current ($I_1$) approximately according to the relationship:

$$P = K_1 + K_2(I_1^{-M}) \quad (5)$$

where M, $K_1$ and $K_2$ are constants
In practice M is often approximately equal to ½ and, consequently, a square root approximation can often be conveniently employed as part of the overall correction algorithm.

The values of the constants $K_1$, $K_2$, $K_3$, and $K_4$ depend upon the configuration of the particular current transformer. Factors such as core material and turns ratio affect the values of the constants which are typically ascertained by experiment with samples of a given core configuration. Typically, the values of $K_1$, $K_2$, $K_3$, and $K_4$ are determined for a particular transformer configuration or production batch by comparing the actual performance of a sample of the transformer configuration to the performance of a standard device when the secondary winding is connected in parallel to a particular impedance or burden. Typically, the error correction factors are generated from a sample of a particular transformer configuration and stored in the memory of the meter's data processing system, often as a table or a mathematical formula relating the error factors to the magnitude of the sensed current. When the current is sampled, the data processing system looks up or calculates the appropriate error correction factors for a current equal to the sensed current and adjusts the magnitude of the sensed current as required by the ratio and phase error correction factors.

Since the phase and ratio errors are peculiar to a particular current transformer or batch of current transformers, maintaining the desired accuracy of the power meter when replacing or adding a current transducer often necessitates reprogramming the meter to update the phase and ratio error correction factors for the new transformer. Updating the error correction factors can be particularly complex when the power meter includes large numbers of current transformers, particularly when the error correction factors are not common to all of the transformers. What is desired, therefore, is a current transducer which can be installed in a power meter without requiring the meter to be reprogrammed to maintain its accuracy.

DETAILED DESCRIPTION OF THE INVENTION

Figure 1:
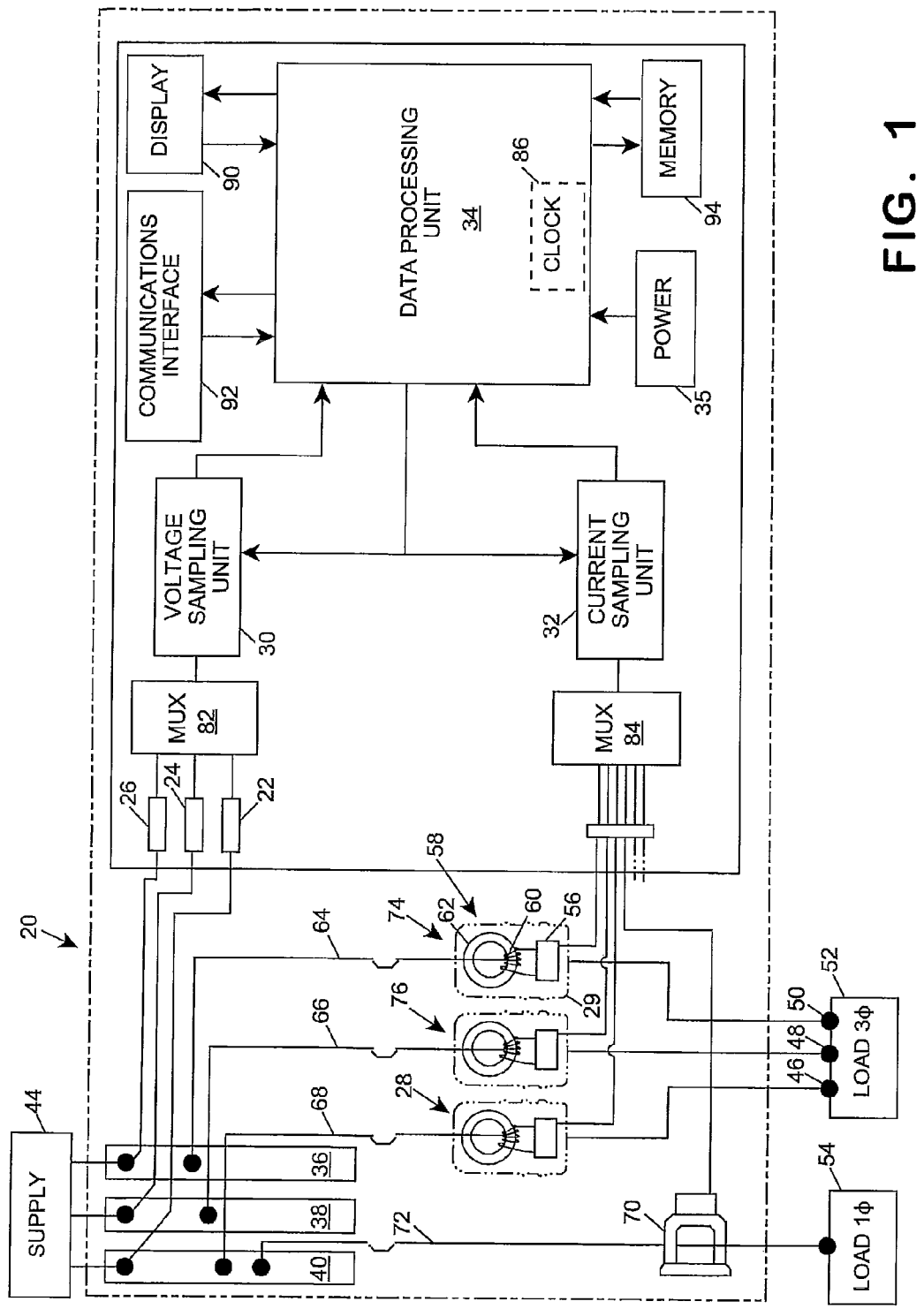
FIG. 1 is a block diagram of an electric power meter incorporating a current transducer.

In a digital power meter, the power and other electrical parameters are typically calculated by a data processing system utilizing measured instantaneous magnitudes of the voltage and current obtained by periodically sampling the analog output of voltage and current transducers. A digital power meter generally comprises at least one, and often several, voltage and current transducers; a sampling unit that momentarily holds the output of the transducers constant and converts the analog magnitudes of the outputs to binary values of finite precision; and a data processing system that reads the magnitudes of the voltage and current samples and calculates the current, voltage, power and other power related electrical parameters from the sample values.

The current transducers of a power meter are not ideal devices and, for accurate metering, the current transducers used in a power meter must be calibrated and the meter must apply error correction factors to the measured values of the current samples to account for the errors produced by a particular set of transducers. For example, a current transducer commonly comprises a current transformer and magnetization of the core of a current transformer produces ratio and phase errors which depend upon the configuration of the particular transformer, including such factors as core material and turns ratio and the magnitude of the current that is being measured. For accurate metering, sample transformers from each production batch are tested with differing burdens to determine the error correction factors to be applied by the data processing system during calculation of the current sensed with a current transformer of that production batch. Typically, the identities of the current transducers, relevant current transformer specifications, such as turns ratio and error compensation factors for the particular set of current transducers making up a meter are stored in the memory of the meter's data processing system for use by the data processing unit when calculating the meter's output.

The nature of a power meter's components complicates repair and modification of installed meters. For example, the numbers of current transducers or the specifications of the current transducers used in a meter cannot readily be changed because the data characterizing the transducers which are stored in the memory of the meter's data processing unit must be updated to reflect the revised configuration and error correction factors. On the other hand, it may be necessary to change one or more current transducers of a meter either to add a current transducer to monitor a new circuit in the facility, repair the meter or accommodate a primary current which, due to a change in the monitored circuit, is out of range for an installed current transducer. Updating error correction data for a meter is difficult because each meter has its own set of configuration data and, even if the data can downloaded from the meter's manufacturer to the memory of the meter's data processing unit, the individualized nature of transducers and meters makes correlating the identity of a current transducer and its configuration data problematic. Replacing a current transducer with another transducer that includes a current transformer of a different production batch may require revising all of the error correction factors stored in the memory in order to maintain the meter's accuracy. The inventor reasoned that if the output of a current transducer was corrected for the phase and ratio errors produced by the current transformer of a transducer for which error correction factors had been stored in the memory of the power meter, the serviceability of a power meter would be greatly enhanced by the ability to replace or add current transducers in installed meters without reprogramming the meter.

Figure 4:
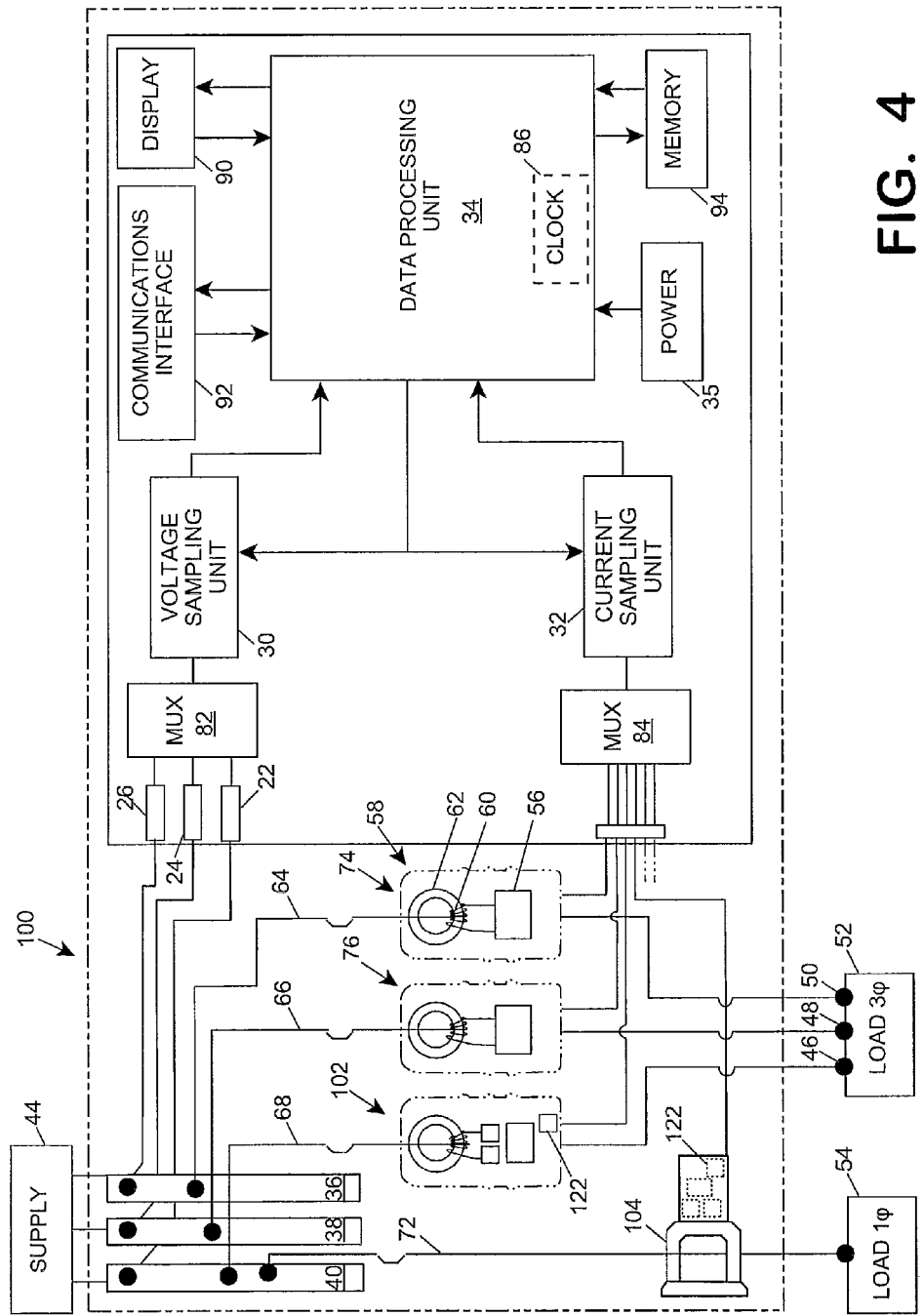
FIG. 4 is a block diagram of an electric power meter incorporating a phase canceling current transducer.

Referring in detail to the drawings where similar parts are identified by like reference numerals, and, more particularly to FIG. 4, an exemplary digital power meter 100, generally similar to the exemplary power meter 20, comprises, generally, a plurality of voltage transducers 22, 24, 26; a plurality of current transducers, for example, current transducers 76 and 74; voltage and current sampling units 30, 32 and a data processing unit 34 to control the sampling units; read the instantaneous magnitudes of the voltage and current; and calculate the power and other output parameters from the magnitudes of a plurality of measured voltage and current samples.

The sampling units 30, 32 each comprise an analog-to-digital converter (ADC) including a sample and hold circuit that periodically, in response to a signal from the meter's data processing unit, holds the output voltage of one of the voltage or current transducers constant and a quantizer that converts the analog output voltage of the transducer to a digital signal. In the sampling units, time, the independent variable of the sinusoidal waveform equation of the electric current and voltage, is converted from a continuum to a plurality of discrete moments and the concurrent magnitudes of the voltage or current transducer signals are converted to discrete, binary values of finite precision. Multiplexers 82, 84 sequentially connect the voltage and current transducers to the respective voltage and current sampling units 30, 32. A clock 86, which may be included in the data processing unit 34, provides a time reference enabling the data processing unit to output at least one sampling signal 88 to trigger the sampling of the voltage and current by the respective sampling units 30, 32.

The outputs of the sampling units are read by the data processing unit 34 which, in a typical digital power meter, comprises at least one microprocessor or digital signal processor (DSP). The data processing unit reads and stores the digital values quantifying the magnitudes of the current and voltage samples and uses the values to calculate the current, voltage, power, and other electrical parameters that are output to a display 90 for immediate viewing or to a communications interface 92 enabling transmission to another data processing system, such as a building management computer, for remote display or further processing, for example formulating instructions to automated building equipment. The digital power meter also includes a memory 94 in which operating instructions for the data processing unit; current and voltage samples; transducer specifications, including error correction factors; and calculated output are stored.

The voltage transducers 22, 24, 26 comprise voltage divider networks that are connected to respective conductors in which the voltage will be measured. Each of the voltage transducers 22, 24, 26 is connected to a respective bus bar 36, 38, 40 conducting a single phase of three-phase power in a power distribution panel. It is convenient to connect the voltage transducers to the bus bars of a power distribution panel because the voltage and phase is the same for all loads attached to one of the bus bars, but the voltage transducer(s) could be connected to respective conductors of the power anywhere between the panel and the load, for example, at terminals 46, 48, 50 of the exemplary 3-phase load 52.

Figure 6:
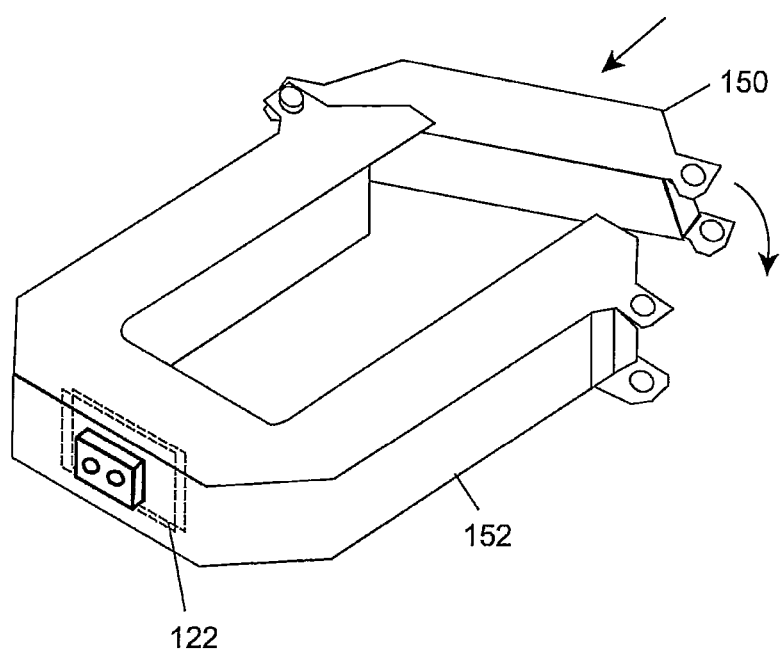
FIG. 6 is a perspective view of a phase canceling current transducer.

The current transducers typically comprise a current transformer, for example current transducer 74 comprises current transformer 58 having a toroidal core 62 defining an aperture. On the other hand, referring to FIG. 6, the current transducer 104 exemplifies a split core current transformer which usually comprises either a C-shaped, U-shaped or bar first core portion 150 that connects the ends a C-shaped or U-shaped second core portion 152. The two portions of the core may be hinged or separable to enable the portions of the core to be opened and then closed around an electrical conductor without disconnecting the conductor.

Current transformers also include a secondary winding, such as the secondary winding 60, which usually comprises multiple turns of conductive wire wrapped around the cross-section of a portion of the core defining the core's aperture. Each conductor of a load current to be measured (or a conductor of a shunt current representative of the load current) is routed through the aperture in the center of a current transformer core. For example, each of the three conductors 64, 66, 68 connecting the exemplary 3-phase load 52 to the supply 44 is routed through the core of the current transformer of one of the three current transducers 102, 74, 76 and the single conductor 72 connecting the exemplary single-phase load 54 to the supply is routed through the split-core of the current transformer of transducer 104. (Neutral conductors are not illustrated). The current flowing in the electrical conductor, the primary current, induces a current in the secondary winding of the current transformer which is commonly conductively connected to a resistor network, such as the resistor network 56, and the magnitude of the secondary current is determined from the amplitude of the voltage at the output of the resistor network. Ideally, the primary current in the conductor is equal to the product of the current in the secondary winding and the turns ratio (n); the ratio of the number of turns in the primary winding ($N_1$), where $N_1$ commonly equals 1, to the number of turns in the secondary winding ($N_2$).

Figure 2:
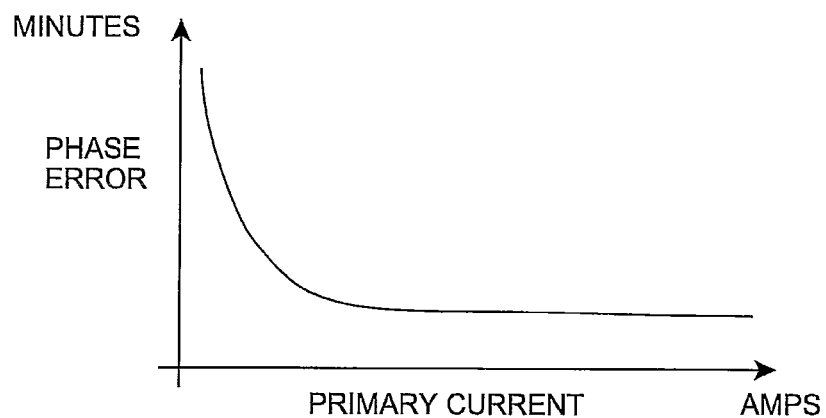
FIG. 2 is a graph of phase error versus primary current for an exemplary current transformer.
Figure 3:
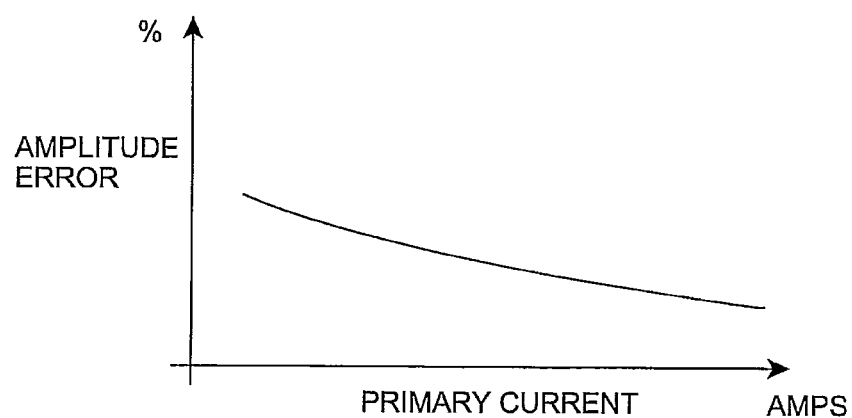
FIG. 3 is a graph of ratio error versus primary current for an exemplary current transformer.

While the primary current in a current transformer is ideally equal to the product of the secondary current and the turns ratio, actual current transformers are not ideal transformers. Current transformer error comprises a phase error and a ratio error caused by magnetization of the core and the meter's data processing system typically adjusts the value of the sensed current to compensate for the effects of phase error and ratio error introduced by the current transformer. Referring to FIGS. 2 and 3, both the phase error and the ratio error vary with the magnitude of the primary current and are unique to a particular transformer configuration or production batch. Typically, the phase and ratio error correction factors are determined by comparing the actual performance of a sample transformer of a particular configuration or production batch to the performance of a standard device when the secondary winding of the transformer is connected in parallel with a particular impedance or burden. The error correction factors for the current transducers used in a meter are typically stored in the memory of the meter's data processing system, often as a table or a mathematical formula. When the current is sampled, the data processing system looks up or calculates the appropriate phase and ratio error correction factors for a current equal to the sample current and adjusts the magnitude of the sample current as required by the correction factors to obtain the actual current being measured. When a current transducer is replaced or added to the meter, the error correction data stored in the memory of the meter's data processing unit must be updated if the meter's accuracy is to be maintained.

Figure 5:
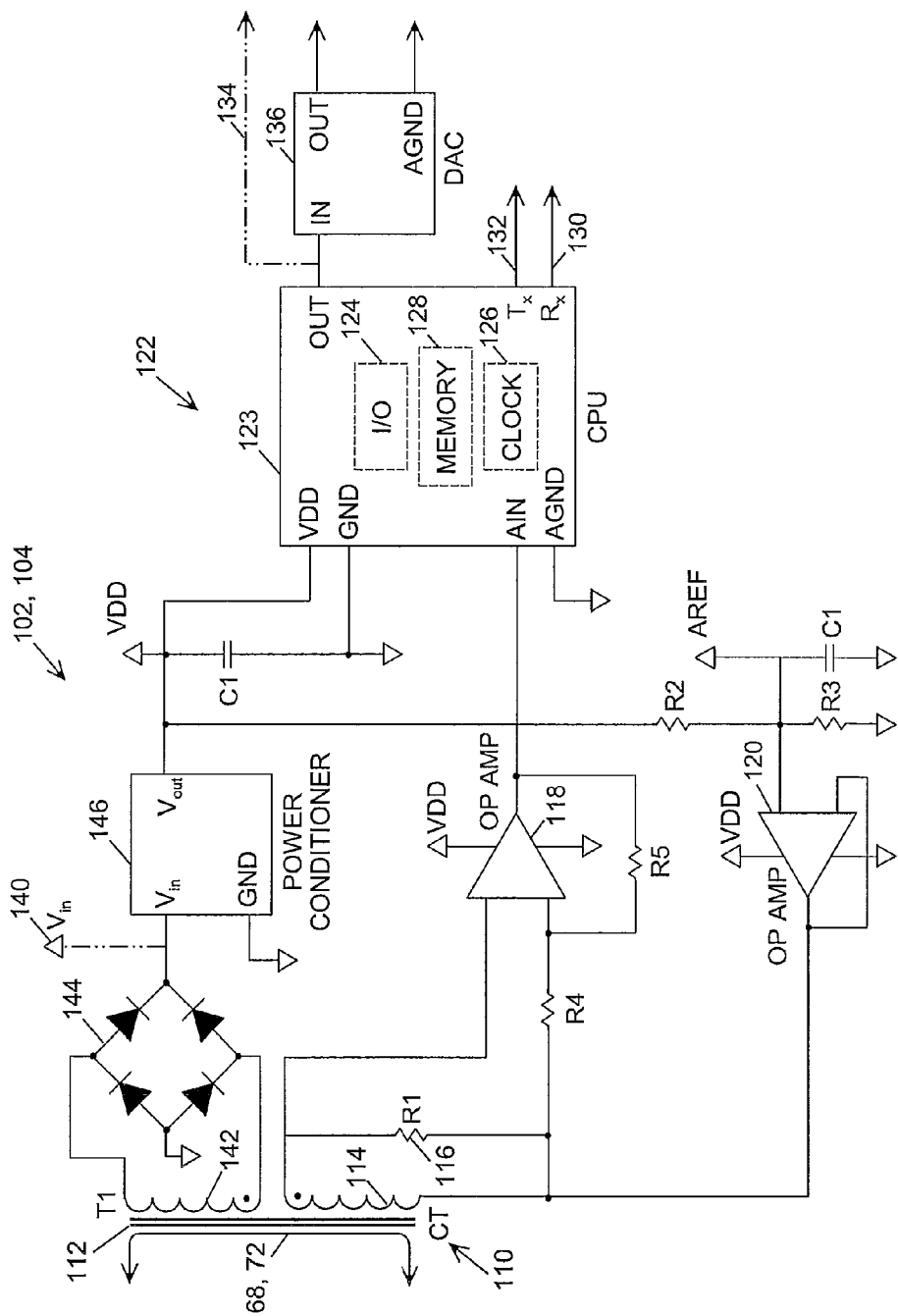
FIG. 5 is a schematic diagram of a phase canceling current transducer.

The current transducers 102 and 104 of the power meter 100 are exemplary phase canceling transducers. Referring also to FIG. 5, the phase canceling current transducers 102, 104 each comprise a current transformer 110 having a core 112 and a conductive secondary winding 114 that encircles a portion of the cross-section of the core. The core 114 may be a single toroidal unit with a central aperture through which the power conductor may be routed or may be a split core comprising hinged or separable core portions that may be separated and then closed to facilitate routing a power cable through the central aperture without detaching an end of the cable.

The secondary winding of the current transformers of the phase canceling current transducers, for example, winding 114, typically comprises multiple turns of wire wrapped around a portion of the core's cross-section. A resistor 116 is connected in parallel with the secondary winding and the inputs to an amplifier 118. The resistor 116 produces a voltage drop in the secondary current that is induced in the secondary winding by the primary current. The amplifiers 118, 120 amplify and limit the voltage of the secondary current.

Each of the phase canceling current transducers 102, 104 also includes an error correction unit 122. Although the error correction unit could comprise individual data processing, input/output and memory devices, the data processing unit 123 of exemplary current transducer 102, 104 preferably includes a microcontroller or computer-on-a-chip (CPU) comprising, generally, a microprocessor or digital signal processor to manipulate data and control the operation, input/output circuitry 124, a transducer clock 126 and a transducer memory 128 in a single device. Error correction factors to be applied to the output of the current transformer of the transducer are stored in the error correction unit's memory 128.

When the current transducer is tested with a standard impedance or burden the output of the transformer is determined by the data processing unit 123 and error correction factors can be stored in the error correction unit's memory with signals to the read 130/write 132 terminals of the data processing unit. The output can be compared to the output of another known transducer and error correction factors calculated and stored in the memory of the transducer's error correction unit that will permit the transducer to mimic the response of the other transducer to any magnitude of the primary current. If it is necessary to replace a current transducer in a meter, updating the error correction factors in the meter's memory is not necessary because the transducer's error correction unit will correct the output of the transducer so that it matches the output of the device that is being replaced.

On the other hand, the error correction factors can provide a correction for the phase and ratio errors produced by the current transformer of the transducer. If a power meter is constructed with phase canceling transducers, it is unnecessary to save error correction factors in the memory of the meter's data processing unit because the transducer's data processing unit can utilize the error correction factors stored in the error correction unit's memory to adjust the output of the transducer for the phase and ratio errors induced by the transducer's current transformer. Phase canceling transducers can be added to the meter or replace transducers installed in the meter without concern for error correction factors stored in the memory of the meter's data processing system.

When the current transducer 102, 104 is installed in a power meter, the error correction unit clock 126 will periodically signal the input/output circuitry 124 to read the output of the amplifier 118. The input/output circuitry comprises an analog-to-digital converter (ADC) including a sample and hold circuit that holds the output of the amplifier 118 constant in response to a time signal and a quantizer that converts the analog output of the amplifier to a digital signal usable by the transducer's data processing unit 122. The transducer's data processing unit 122 retrieves one or more error correction factors stored in the memory 128 and applies the error correction factors to the sampled data to adjust the sample data to for the phase and ratio error of the transducer's current transformer or to match the output of another transducer, typically a current transformer having error correction factors that are stored in the memory 94 of the meter's data processing unit 34. Phase shift compensation is applied to the data and then shifted back 360° minus the compensating phase shift to yield accurate phase and magnitude representation of the data.

The data processing unit of the transducer outputs the adjusted sample data. If the power meter can utilize a digital signal, a digital representation of the sample may be transmitted to the meter's data processing unit. However, the current transducers of many meters output an analog voltage between 0 and 1 volts which is sampled by the meter's current sampling unit, for example the current sampling unit 32. The phase canceling current transducers 102, 104 may comprise a digital-to-analog (DAC) converter 136 which converts the digital output of the error correction unit to an analog signal. In response to the clock 86 in the meter's data processing unit 34, the multiplexer 84 connects each of the meter's current transducers to the current sampling unit 32 which samples the analog output of the respective transducer and converts it to a digital value useful in the meter's data processing unit. If the output of a phase canceling current transducer 102, 104, has been adjusted to mimic the output of a transducer for which error correction factors have been stored in the memory of the meter's data processing unit, the meter's data processing unit can process the output of the phase canceling transducer using the stored error correction factors to accurately calculate the current. It is not necessary to download revised error correction factors when a transducer is replaced, because the primary current of the sample can be accurately determined by applying the error correction factors that are stored in the memory of the meter's data processing unit.

On the other hand, in a meter originally equipped with phase canceling current transducers, updating error correction factors in the meter's memory is unnecessary because the error correction factors for the transducers are stored in the error correction unit's memory and the output of the transducer is corrected for the phase and ratio error produced by the transducer's current transformer when it is sampled by the meter's data processing unit.

Power for operating the current transducer can be obtained by a connection 140 to the meter's power source 35 or another external source of power. However, many meters do not have a readily available power connection and, alternatively, the phase canceling transducers can be self powered. As illustrated in FIG. 5, the phase canceling transducer includes a tertiary winding 142 around the cross-section of the current transformer's core. The primary current flowing in the power cable 68, 72 induces a voltage and current in the tertiary winding which is rectified by a bridge 144. The rectified power, in the case of the self powered transducer, or the external power is input to a power conditioning device 146 which is connected to power the amplifiers and the error correction unit.

A phase canceling current transducer includes a memory in which error correction factors are stored enabling a data processing unit in the current transducer to adjust the transducer's output for phase and ratio errors produced by the transducer's current transformer or to mimic the operation of a second transducer having one or more error correction factors stored in the power meter's memory.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A unitary current transducer having a transducer output representing a primary current in an electrical conductor, said current transducer comprising:
    (a) a current transformer including a secondary winding, a secondary current inducible in said secondary winding by said primary current in said electrical conductor; and
    (b) a correction unit operable to adjust said transducer output for at least one of a phase error and a ratio error induced in said secondary current by magnetization of said current transformer.

2. The unitary current transducer of claim 1 wherein said correction unit is operable to adjust said transducer output for a phase error produced by another current transformer.

3. The unitary current transducer of claim 1 wherein said correction unit is operable to adjust said transducer output for a ratio error produced by another current transformer.

4. The unitary current transducer of claim 1 wherein said correction unit comprises:
    (a) a sampling unit to convert said secondary current to at least one discrete digital representation of said secondary current;
    (b) a memory storing an error correction factor; and
    (c) a processing unit determining said transducer output by applying said error correction factor to adjust said digital representation of said secondary current.

5. The unitary current transducer of claim 4 wherein said correction unit is operable to adjust said transducer output for a phase error produced by another current transformer.

6. The unitary current transducer of claim 4 wherein said correction unit is operable to adjust said transducer output for a ratio error produced by another current transformer.

7. The unitary current transducer of claim 4 further comprising a digital to analog converter converting a digital representation of said transducer output from said processing unit to an analog representation of said transducer output.

8. The unitary current transducer of claim 1 wherein said current transformer further includes a tertiary winding, a tertiary current induced in said tertiary winding by said primary current providing electrical energy to operate said correction unit.

9. A unitary current transducer having a transducer output representing a primary current in an electrical conductor, said current transducer comprising:
 (a) a current transformer including:
  (i) a core having a portion defining an aperture to receive said electrical conductor; and
  (ii) a secondary winding including a portion encircling a cross-section of said portion of said core defining said aperture, a secondary current inducible in said secondary winding by said primary current;
 (b) a sampling unit converting said secondary current to at least one discrete sample current, said sample current represented by a digital value;
 (c) a memory storing an error correction factor; and
 (d) a processing unit calculating said transducer output from said error correction factor and said sample current.

10. The unitary current transducer of claim 9 wherein said error correction factor corrects said transducer output for a phase error produced by said current transformer.

11. The unitary current transducer of claim 9 wherein said error correction unit corrects said transducer output for a ratio error produced by said current transformer.

12. The unitary current transducer of claim 9 wherein said error correction factor corrects said transducer output for a phase error produced by another current transformer.

13. The unitary current transducer of claim 9 wherein said error correction unit corrects said transducer output for a ratio error produced by another current transformer.

14. The unitary current transducer of claim 9 further comprising a digital to analog converter converting a digital representation of said transducer output from said processing unit to an analog representation of said transducer output.

15. The unitary current transducer of claim 9 wherein said current transformer further includes a tertiary winding, a tertiary current induced in said tertiary winding by said primary current providing electrical energy to operate said correction unit.

16. A meter comprising:
 (a) a unitary current transducer having a transducer output representative of a primary current in a conductor, said current transducer comprising:
  (i) a current transformer including a secondary winding, a secondary current induced in said secondary winding by said primary current in said conductor and representative of said primary current; and
  (ii) a correction unit operable to adjust said transducer output for a transformer magnetization induced error in said secondary current; and
 (b) a data processing system configured to sample said transducer output and determine said primary current from a plurality of said samples of said transducer output as adjusted for said magnetization error by said unitary current transducer.

17. The meter of claim 16 wherein said correction unit corrects said transducer output for a phase error produced by said current transformer.

18. The meter of claim 16 wherein said error correction unit corrects said transducer output for a ratio error produced by said current transformer.

19. The meter of claim 16 wherein said current transducer further comprises a digital to analog converter converting a digital representation of said transducer output from to an analog representation of said transducer output.

20. The current transducer of claim 16 wherein said current transformer further includes a tertiary winding, a tertiary current induced in said tertiary winding by said primary current providing electrical energy to operate said correction unit.

21. A meter for measuring a primary current in a conductor; said meter comprising:
 (a) a meter memory storing a first error correction factor for adjusting an output of a first current transducer for an error produced by said first current transducer;
 (b) a second current transducer having a second transducer output representative of said primary current, said second current transducer comprising:
  (i) a current transformer including a secondary winding, a secondary current induced in said secondary winding by said primary current in said conductor and representative of said primary current;
  (ii) a current transducer memory storing a second error correction factor applicable to adjust said output of said second current transducer to approximate an output of said first current transducer; and
  (iii) a correction unit operable to apply said second error correction factor to adjust said second transducer output; and
 (c) a data processing unit configured to determine said primary current by applying said first error correction factor to a plurality of samples of said output of said second current transducer.

22. The meter of claim 21 wherein said first error correction factor corrects said output of said first transducer for a phase error produced by said first transducer.

23. The meter of claim 21 wherein first correction factor corrects said output of said first transducer for a ratio error produced by said first transducer.

24. The meter of claim 21 wherein said second current transducer further comprises a digital to analog converter converting a digital representation of said second current transducer output from to an analog representation of said second current transducer output.

25. The current transducer of claim 21 wherein said current transformer further includes a tertiary winding, a tertiary current induced in said tertiary winding by said primary current providing electrical energy to operate said correction unit.

* * * * *